United States Patent [19]  [11] 4,208,698
Narasimhan  [45] Jun. 17, 1980

[54] NOVEL HYBRID PACKAGING SCHEME FOR HIGH DENSITY COMPONENT CIRCUITS

[75] Inventor: Tanjore R. Narasimhan, Farmingville, N.Y.

[73] Assignee: ILC Data Device Corporation, Bohemia, N.Y.

[21] Appl. No.: 845,567

[22] Filed: Oct. 26, 1977

[51] Int. Cl.² .............................................. H05K 5/00
[52] U.S. Cl. ................................ 361/414; 174/52 FP; 361/402
[58] Field of Search ....................... 361/402, 414, 393; 174/52 FP, 525

[56] References Cited

U.S. PATENT DOCUMENTS

| 3,102,213 | 8/1963 | Bedson et al. | 361/414 |
| 3,289,045 | 11/1966 | Pritikin et al. | 361/402 |
| 3,404,215 | 10/1968 | Burks et al. | 174/52 FP |
| 3,768,157 | 10/1973 | Buie | 174/52 FP |
| 4,012,579 | 3/1977 | Fox et al. | 174/57 FP |

Primary Examiner—David Smith, Jr.
Attorney, Agent, or Firm—Lerner, David, Littenberg & Samuel

[57] ABSTRACT

A hybrid solid state package in which integrated circuits, precision resistor networks, capacitors and their interconnections are accommodated on a multi-layer process substrate while thick film resistors and interconnections provided on a separate substrate, which subassemblies are then sandwiched together using film epoxies are inserted within a single package, to thereby yield a structure of significantly smaller size and lighter weight and having minimal number of input-output interconnections as compared with conventional designs and without impairing quality or reliability.

4 Claims, 5 Drawing Figures

NOVEL HYBRID PACKAGING SCHEME FOR HIGH DENSITY COMPONENT CIRCUITS

BACKGROUND OF THE INVENTION

The present invention relates to electronic solid state circuits of LSI and MSI types and more particularly to novel method and apparatus for yielding hybrid structures employing such solid state electronic circuitry to produce a hybrid package which is smaller, lighter in weight and has fewer input-output interconnections than are encountered in packages of conventional design.

Recent emphasis on hybrids, particularly in military applications, is toward the standardization of functions in packaging, having a high reliability level and a high level of quality while achieving lower cost and reduction in total occupied volume.

With the availability of LSI and MSI devices with complex functions, present trends are toward the development of more sophisticated circuit innovations using such devices with a minimum number of components. Other recent developments have been made in the field of synchro and data conversion modules and subsystems in which new product design and developement programs have been undertaken to fill the needs of both industrial and military markets, such products including CMOS synchro and resolver converters with 10- to 16-bit resolution and accuracies, 14-bit multiplying digital to analog converters (DAC's); video sample and hold circuits; high speed A/D converters; and active filters.

The assignee of the present invention has developed such products incorporating unique features in the design, packaging, processing, and manufacturing techniques. Considering one of these new product areas as exemplary, such as synchro products, a wide variety of synchro functions are currently available in discrete modules and multi-package hybrids. However, many end uses, such as airborne applications, require features among which are significant reductions in both size and weight, compactness, rugged design and high reliability and lower power. The assignee of the present invention has developed products fulfilling these requirements, as well as those of the Standard Electronic Module program specification, by focusing special attention on every level of design, packaging concept, processing, control, testing and the like.

The complexity and high component density of the circuits utilized to perform the necessary functions make it extremely difficult to design a hermetic package which is small enough to meet military and especially airborne specifications using standard hybrid packaging techniques. Thus the major problem is one of realizing adequate mounting area for passive and active components which is much greater than twice the available area of the desired package size without degrading or reducing the quality, reliability and environmental requirements. Also, the limitations encountered in fabrication techniques and materials further limit the size reductions presently capable of being obtained.

BRIEF DESCRIPTION OF THE INVENTION

The present invention provides a hybrid circuit structure whose design is characterized by the employment of thin film and integrated circuits arranged on a suitable substrate and thick film components mounted upon a separate substrate in which the substrates and other components are joined by means of suitable conductive and non-conductive epoxies respectively chosen for effecting appropriate electrical and mechanical bonding of the substrates and discrete components to provide a single, unitary package of high mechanical strength and electrical integrity.

By judicious partitioning of the circuitry, IC's, precision thin film resistors, capacitors, add-on components and their interconnections are accomodated on a top multi-layer substrate, while non-critical resistors and associated interconnections are processed upon a separate substrate or substrates. The subassemblies are mechanically joined together to form an integral assembly which is inserted in a hermetic package. The total electrical circuit function is preserved with proper interconnections being provided between and among the substrates, subassemblies and output pins.

The multi-substrate assembly approach yields a package of reduced size and weight and having minimum input/output interconnections without impairing the quality or reliability of the circuitry and its operation.

BRIEF DESCRIPTION OF THE FIGURES AND OBJECTS OF THE INVENTION

An object of the present invention is to provide a novel hybrid packaging circuitry and method for yielding such packages which are characterized by having high component density and excellent reliability and ruggedness, all of which are provided in a structure of significantly reduced size and volume as compared with conventional structures.

The above as well as other objects of the present invention will become apparent upon reading the accompanying description and drawings in which:

FIG. 2 shows a plan view of the bottom substrate employed in the hybrid package for the circuit of FIG. 1a.

FIG. 3 shows a plan view of the top substrate utilized for mounting the integrated circuits (IC's) and other critical components employed in the converter of FIG. 1a.

FIG. 4 shows a perspective view of the substrates of FIGS. 2 and 3 in the assembled fashion with integrated circuits and other components and wire bond interconnections therebetween and shown mounted within a metal package.

FIG. 4a shows a sectional view of the assembled package of FIG. 4 looking in the direction of arrows 4a—4a.

DETAILED DESCRIPTION OF THE INVENTION

Figure 1:
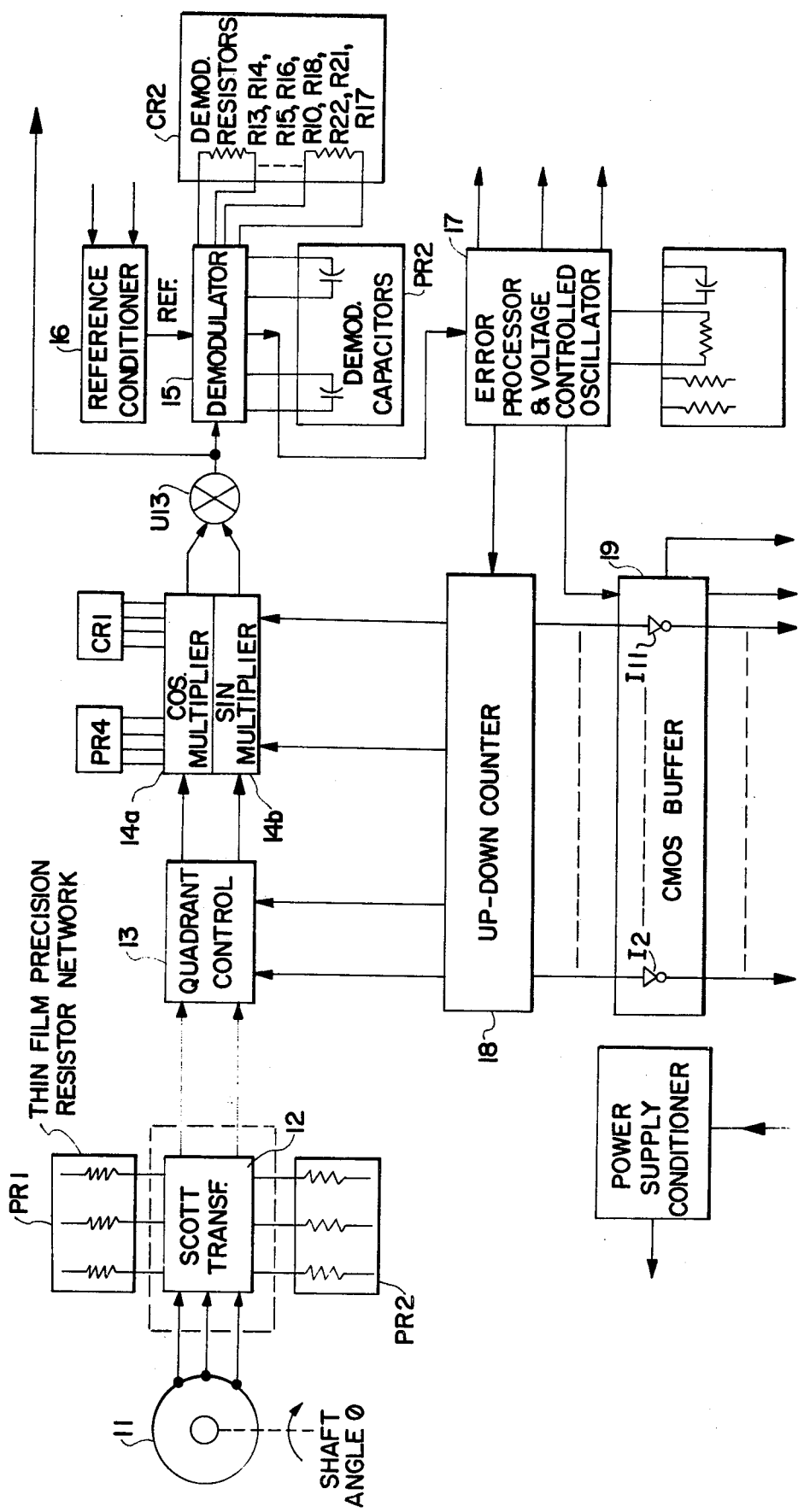
FIG. 1 shows a simplified block diagram of a multibit hybrid synchro-to-digital converter.

Considering FIG. 1, synchro or resolver angle data is transmitted as the ratio of carrier amplitudes appearing across the output terminals of the control transmitter 11 whose rotor is rotated to the appropriate angle $\theta$. The carrier amplitudes vary as the shaft angle is changed. The angle information is transformed from synchro format, i.e. $\sin \theta \cos \omega t$; $\sin (\theta + 120°) \cos wt$; and $\sin (\theta + 240°) \cos wt$ to resolver format i.e. $\sin \theta \cos wt$, and $\cos \theta \cos wt$ by a Scott transformer 12. The converter performs the trigonometric computation:

$\sin (\theta - \phi) = \sin \theta \cos \phi - \cos \theta \sin \phi$, where $\theta$ is the input data angle and $\phi$ represents the angle contained in the up-down counter 18. The error function, $\sin (\theta - \phi)$, is processed and controls the up-down counter such that at the steady state null condition, $\theta = \phi$.

The error processor includes an integrator for eliminating the one or two bits of hunting typically present in conventional servos.

Prior to updating due to an input data change, a converter busy signal is generated at output CB of FIG. 1. When it returns to quiescence, the data may be "frozen" by driving the Inhibit terminal INH (FIG. 1) low enabling parallel transfer of data from the outputs of inverters $I_2$ to $I_{11}$.

FIG. 1 shows the diagrammatic view of a hybrid synchro-to-digital converter which, as will be described herein, is fabricated into a hybrid package as will be described herein.

A Scott-T transformation circuit 12 is comprised by three inputs S1, S2 and S3 coupled to respective outputs of "synchro". The resistors in group PR1 are utilized in the transformation circuit, as are resistors in group PR2, both of which groups are connected to the IC's 12a.

The outputs of the IC's coupled to the MSI and LSI digital switches which serve as the quadrant selector circuit 13 and the cosine and sine multipliers 14a and 14b.

The outputs of the digital switches are connected to groups of resistors PR4 and CR1 which serve as the weighted resistors for the sine and cosine multiplier circuitry 14a–14b.

The resistors in groups PR4 and CR1 are coupled in common to buses 105 coupled to the inputs of summing circuit U13. The output of the summing circuit U13 is coupled to a demodulator circuit 15, comprised of IC's, and precision components shown at CR2 and PR2, for demodulation of the summed signal. Input REF, from Reference Condition circuit 16, removes the carrier. The output signal then undergoes error processing by error processing circuitry and is utilized to operate a voltage controlled oscillator both included in circuit 17, and which includes resistors such as R30, R31 and capacitor C6, shown at PR3, which cooperate to develop an output signal whose frequency is a function of the error processed signal.

The output of the voltage controlled oscillator (VCO) is coupled to pulse the up-down counter 18 comprised of integrated circuits interconnected to provide a counter of ten binary stages.

The outputs of these stages are coupled to the switch control inputs of the digital switches employed in the sine and cosine multipliers 14a and 14b, and are further simultaneously coupled to the inputs of each of the inverters I in CMOS buffer 19 to provide digital output levels.

The manner of operation is such that the resistors in groups PR4 and CR1 each have a predetermined "weighted" value to create a function generator ladder network. The terminals of the weighted resistors are all connected in common to the summing circuit U13. The signal created in the common line coupled to the input of the summing circuit develops a single $\sin(\theta - \phi)$ whose current magnitude is a function of the input signal, i.e. $\sin(\theta - \phi) = \sin\theta\cos\phi - \cos\theta\sin\phi$ which is formed as a result of the fact that the input signal $\sin\theta$ is modified by the digital input and weighted resistors by $\cos\phi$ to form the product thereof.

The current signal which is applied to the summing circuit U13, generates a voltage signal commonly referred to as an error signal.

In the instance where the converter utilizes an AC carrier signal, the output is coupled through a demodulator circuit to remove the carrier signal. The error signal then is applied to an error processing circuit as described hereinabove to generate a d.c. voltage level proportional to the difference between the angles $\theta$ and $\phi$. This d.c. voltage is applied to the voltage controlled oscillator described hereinabove which functions to generate output pulses at a pulse rate dependent upon the magnitude of the d.c. signal applied to its input. The output pulses are applied to the digital binary counter.

Assuming that no signal is developed for the angle $\phi$ and thereby assuming the angle to be zero degrees, the error signal will be quite large, causing the voltage controlled oscillator to develop pulses at a high repetition rate representative of the error signal $\phi$.

The pulses are accumulated in the counter which develops a digital binary output applied to the control inputs of each of the digital switches in the sine and cosine multipliers to establish the modifying values cosine $\phi$ and sine $\phi$ to form the products described hereinabove. The angle $\phi$ thus increases significantly to create an increasing smaller error voltage value, thereby reducing the number of pulses developed by the voltage controlled oscillator until ultimately the error control signal drops to zero or a null value, in which case the voltage controlled oscillator (VCO) terminates the generation of pulses and the processing operation is thereby complete. The desired digital representation of the angle $\theta$ thus appears at the output terminals of the substrate upon which the circuitry is mounted through the invertors I2 through I11.

In order to assure a high degree of accuracy in the circuitry, it is important to provide those elements which are critical in nature with very tight tolerances.

In this regard, the precision resistance elements, which are preferably in the form of precision resistor thin film networks, are those arranged within the dotted regions PR1, PR2a through PR2d, PR3 and PR4.

The resistance elements contained in the regions CR1 through CR7 are resistors of the thick film type which are characterized by being formed upon the ceramic substrate by a screening process as will be more fully described. Their tolerances are of the order of ±1% to ±5%.

The remaining resistors are characterized by having tighter tolerances which are of the order of ±0.01% to ±0.10%.

Figure 2:
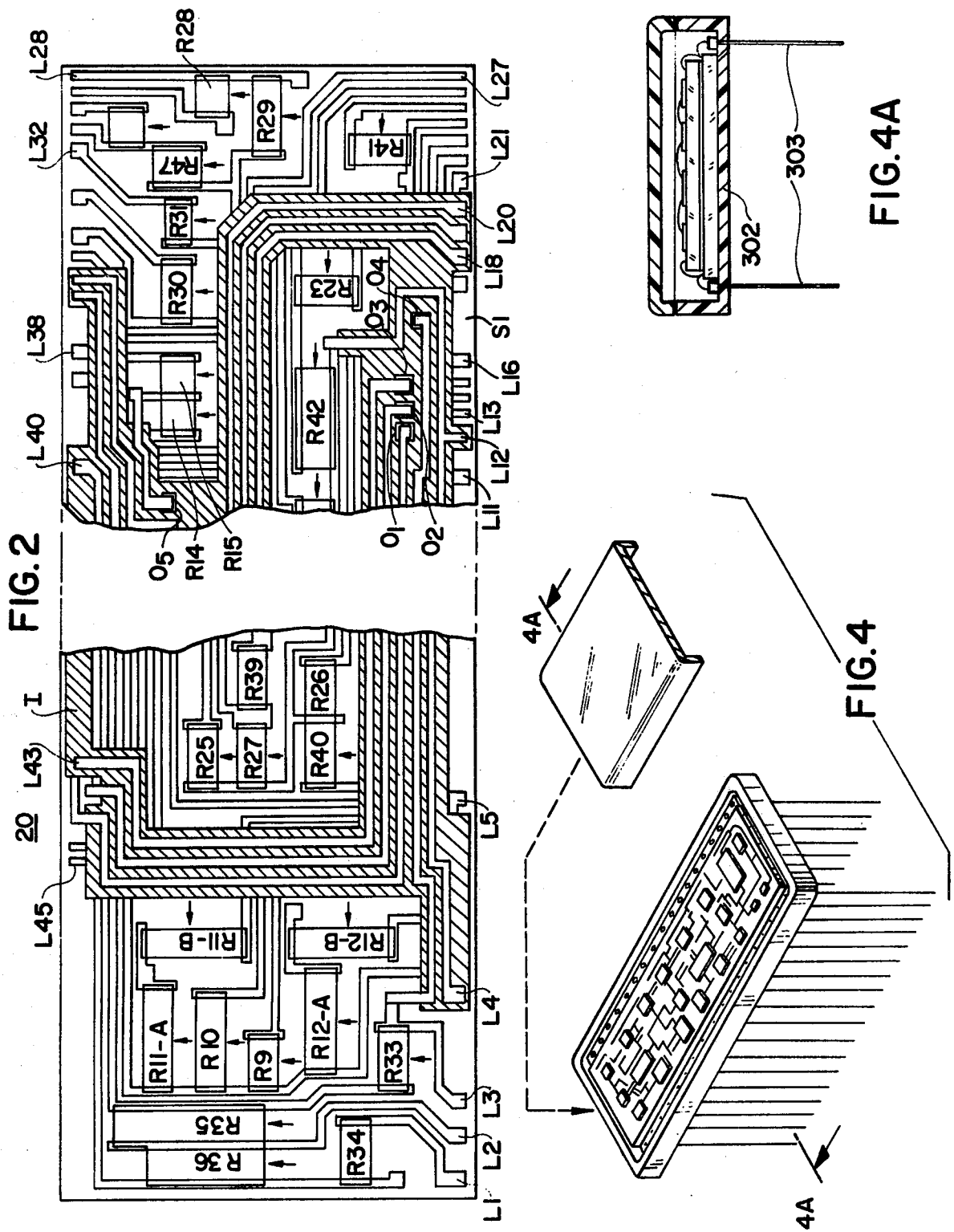

FIG. 2 shows a plan view of the bottom substrate 20 upon which the high ohmic value and non-critical resistance thick film elements are mounted. For example, resistors R9 and R10 are resistors of ±3% tolerance; resistors R23, R35, R36, R42, R14, R15, R34, R33 and R41 are all ±1% tolerance; and the remaining resistors are ±5% tolerance.

The manner of fabrication of the bottom substrate assembly is to provide an insulating (ceramic) substrate S1 and form plurality of separate conductive layer patterns thereon, the layers comprised of the leads having terminals L1 through L3, L5 through L9, L11, L13 through L17, and L21 through L27 being formed as a first conductive printed wiring pattern upon a portion of the ceramic substrate S1. Remaining portions of the ceramic substrate are used to form the thick film resistor elements produced preferably by a screening process upon one or more leads of the first printed wiring pattern. A first layer I of insulation (typically glass) is then applied over selected portions of the first printed wiring pattern said insulation layer being shown in a crosshatched manner in FIG. 3.

A second conductive printed wiring pattern comprises the conductive leads L4, L10, L12, L18 through L20, L36, L37, L40 and L43 which are formed upon the insulation material shown as the crosshatched insulation pattern to provide adequate electrical insulation therebetween.

The thick film resistor elements which are shown as being formed upon the appropriate leads or pairs of leads in the first printed wiring patterns are then trimmed in order to provide the desired ohmic value. The trimming chemicals employed do not affect the ceramic substrate.

Since the chemicals used for trimming significantly affect the glass insulation layers and the printed wiring patterns these resistor elements cannot be formed upon either glass or printed wiring layers.

An insulation layer is formed upon the second printed wiring pattern. Openings (such as $O_1$-$O_5$) are left in each insulation (glass layer) to provide a bonding area for electrically bonding leads.

Figure 3:
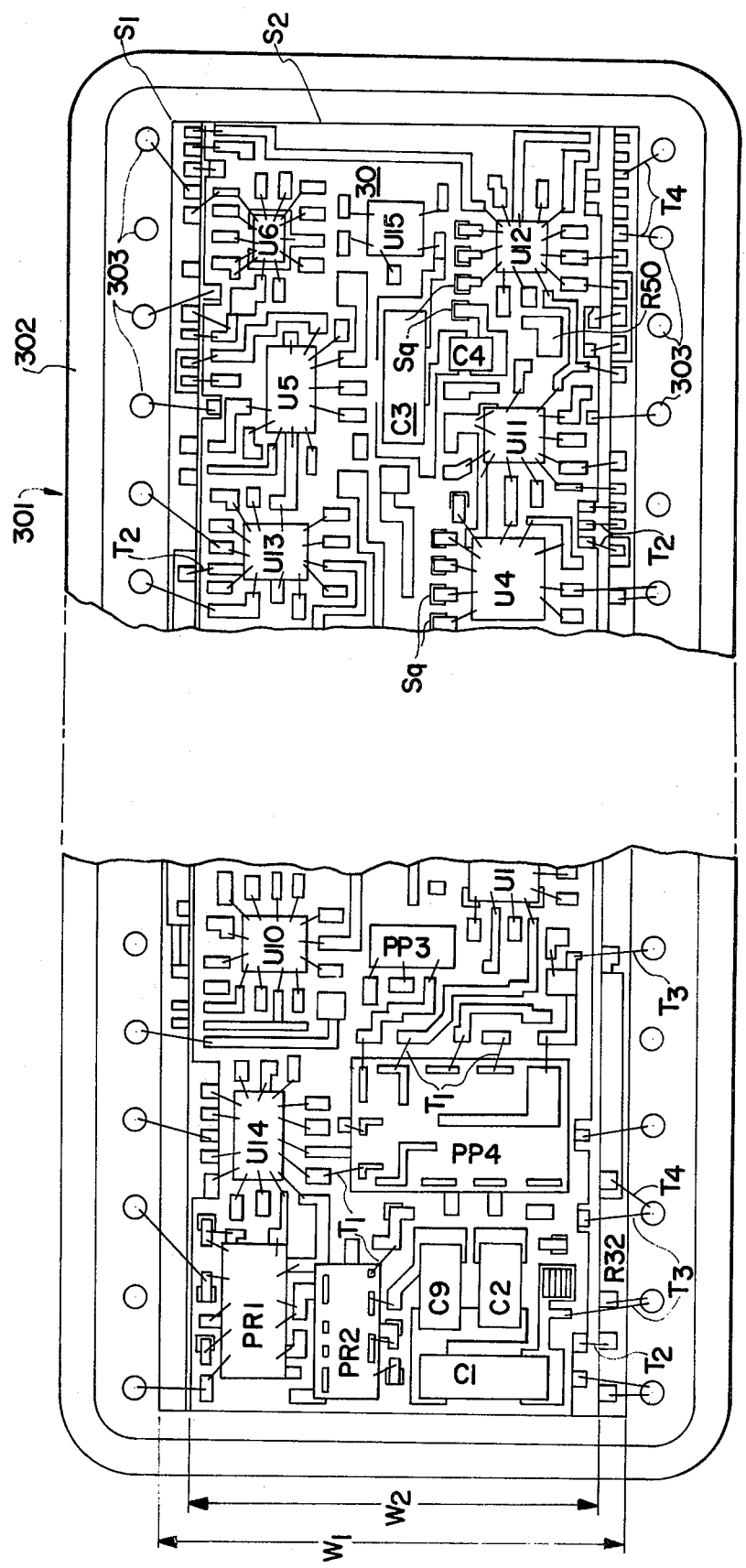

As shown in FIG. 3, the top substrate assembly 30 which is adapted to support the integrated circuits, the precision thin film resistor networks, the capacitors and their interconnections is formed in a similar fashion such that the first conductive printed wiring pattern comprised is formed upon the surface of an insulating (ceramic) substrate S2. A layer of insulation (glass) is laid upon the first wiring pattern to enable the formation of a second conductive printed wiring pattern. In turn, a third layer of insulation is deposited thereon to permit the third and final wire bonding pattern which, in addition to printed wiring as shown, is provided with a plurality of conductive pads for the mounting of the integrated circuits (IC's) and high precision passive components. Designated portions of the printed wiring are left bare for subsequent electrical connections.

The substrates are then joined together using film epoxies to form one integral unit, having an adhesive strength capable of withstanding high-G forces. This is accomplished by heating the bottom substrate 20 and placing a thin epoxy film upon the top surface. The substrate is preferably placed on a hot plate heated to a level sufficient to heat the film epoxy and insufficient to damage the bottom substrate and the elements mounted thereon. Typically the substrate is heated to a level in the range from 150°-200° C. The epoxy film has a thickness preferably in the range from 3-7 mils and serves to compensate for any warpage of undulations in either the top or bottom substrates, or both.

The top substrate has its undersurface pressed against the epoxy film thereby mechanically bonding the substrates together.

The integrated circuits (IC's) and other high precision elements are mounted upon conductive pads comprised of exposed conductive areas of the printed wiring patterns by means of conductive epoxy to provide excellent mechanical and electrical bonds. Conductive pads formed from sublayers are built up with a suitable conductive layer (i.e. gold) sufficient to make the mounting surface of every conductive pad coplanar with the top-most surface. Depending upon the particular components involved, epoxies of either the conductive or nonconductive type are employed for mounting of the components upon the respective substrates and bonding pads. The width of substrate S1 is greater than that of substrate S2 to expose the aforementioned terminals provided on substrate 20. Ultrasonic or pulsed thermal compression wire bonding techniques are utilized in the interconnection of the terminals and the circuit elements.

The integrally joined substrates are mounted upon the recess of a dual-in-line package 301 (FIGS. 3 and 4) comprised of a base member 302 and a plurality of pins 303 extending through base 302 and having their upper ends flush with the upper surface of base 302 and having their lower ends extending well below the base member to facilitate electrical connection to associated circuitry.

The bottom substrate is preferably mounted to the base member with an epoxy and utilizing a method similar to that described above.

The wire bonding connections are then made between and among the various components, leads and circuits. As was set forth above, the width $W_1$ of the bottom substrate is greater than the width $W_2$ of the top substrate, exposing the conductive pads along both longitudinal sides. Connections may be seen to be of four types: ($T_1$) between conductive pads on the top substrate; ($T_2$) between conductive pads on the top and the bottom substrates; ($T_3$) between conductive pads to the top substrate and the package leads 303; and, ($T_4$) between conductive pads of the bottom substrate and the package leads. Some examples of these interconnection types have been labelled $T_1$ through $T_4$ in FIG. 3. Conductive pads from sublayers are characterized by the rectangular or square shaped openings Sq provided therefor.

The synchro converter utilizes a variety of different precision components and circuits. Capacitor elements are designated $C_1$ through $C_9$; precision resistors $R_8$, $R_{32}$, $R_{46}$, PR1-PR4, etc. and integrated circuits U1-U15 comprising comparators, amplifiers, digital switches, counters, etc.

As can clearly be seen, the passive components and integrated circuits occupy a good deal of the total surface area provided by the top substrate. As a result very little if any space remains for further components. The dense packaging dictates the need for multilayers of printed wiring patterns since it is virtually impossible to provide the necessary interconnections on a single surface without greatly increasing the size of the single substrate. Discrete components must be mounted upon the top-most surface. However, resistors requiring trimming must be formed directly upon the ceramic substrate so that the chemicals used during trimming will not affect other layers. By forming these components in the manner taught by the present invention all of the above requirements are fully met and further yield a much smaller package than is available through the use of conventional techniques.

The synchro converter described utilizes the number of components as shown (about components on the top substrate 30 on the bottom substrate), a large number of leads contained in the printed wiring patterns and over 350 wires interconnecting the printed wire patterns discrete components and circuits and the package leads. The wire leads are typically one mil gold wire joined to the conductive pads by thermocompression bonding. Other bonding techniques may be used, if desired.

The metallic base is sealed with a metal cover or lid 305, see FIG. 4. Parallel seamed welding techniques are employed to obtain good hermeticity level in an inert atmosphere.

The overall package size is 1.9" (length) by 0.77" (width) by 0.20" height-excluding pins of package. The integrated substrates are necessarily smaller, yielding a high density package of small size.

Although the invention has been described in connection with the production of a synchro converter, it should be understood that the same techniques may be employed in any application requiring a small package of high component and interconnection density electronic circuits.

What is claimed is:

1. A compact high density solid state electronics package comprised of integrated circuit components, and discrete impedance elements and their interconnections, said package comprising:
    a first planar insulating substrate having at least a first printed wiring pattern formed upon one major surface of said first substrate and a plurality of thick film impedance elements deposited upon selected portions of said first substrate and overlying at least portions of said printed wiring pattern, said thick film impedance elements having been trimmed to provide the desired impedance values;
    said first printed wiring pattern including a first set of connection terminals brought out to a position adjacent at least one border of said first substrate;
    a second planar insulating substrate;
    a second printed wiring pattern formed on one major surface of said second substrate;
    an intermediate layer of insulation deposited upon at least portions of said second printed wiring pattern;
    a third printed wiring pattern formed on said intermediate insulation layer;
    each of said second and third printed wiring patterns including a plurality of thin film impedance elements deposited upon selected portions of their associated printed wiring patterns formed on said second substrate;
    the tolerance ranges of the thin film impedance elements being substantially less than the tolerance ranges of said thick film impedance elements;
    at least one integrated circuit member being adhesively joined upon the surface of said third printed wiring pattern, said second and third printed wiring patterns including a second set of connection terminals brought out to positions along one border of the major surface of said second substrate;
    means for adhesively bonding said one major surface of said first substrate to the undersurface opposite said one major surface of said second substrate so as to substantially cover said first printed wiring pattern and said thick film impedance elements;
    said border of said second substrate being positioned to expose said first set of connection terminals; and
    means for electrically interconnecting terminals of said first connection terminal set to selected terminals of said second connection terminal set.

2. The apparatus of claim 1 further comprising a dual in-line mounting package having a base member and a plurality of connection terminal leads with their upper ends exposed along the upper surface of the base member extending through said base member and their lower ends extending downwardly beneath the underside of the base member;
    said first substrate being mounted upon said upper surface with said first and second sets of connection terminals being adjacent to the upper ends of said terminal leads;
    wire means electrically interconnecting selected terminals of said first and second sets of connection terminals and said terminal leads.

3. The apparatus of claim 1 wherein selected ones of said thin film impedance elements and of said integrated circuits joined to said second substrate are joined thereto by means of a conductive adhesive.

4. The apparatus of claim 1 where said first substrate is joined to said second substrate by means of a film adhesive comprising a film epoxy, said film adhesive having a thickness sufficient to compensate for any irregularities in the first and second substrates being joined.

* * * * *